United States Patent
Lehtinen et al.

(10) Patent No.: US 12,362,288 B2
(45) Date of Patent: Jul. 15, 2025

(54) DEVICE FOR SHIELDING AT LEAST ONE QUANTUM COMPONENT

(71) Applicant: TEKNOLOGIAN TUTKIMUSKESKUS VTT OY, Espoo (FI)

(72) Inventors: Janne Lehtinen, Espoo (FI); Antti Kemppinen, Espoo (FI); Emma Mykkänen, Espoo (FI); Mika Prunnila, Espoo (FI); Alberto Ronzani, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 18/278,241

(22) PCT Filed: Feb. 17, 2022

(86) PCT No.: PCT/FI2022/050102
§ 371 (c)(1),
(2) Date: Aug. 22, 2023

(87) PCT Pub. No.: WO2022/180301
PCT Pub. Date: Sep. 1, 2022

(65) Prior Publication Data
US 2024/0038680 A1    Feb. 1, 2024

(30) Foreign Application Priority Data

Feb. 23, 2021  (FI) ..................................... 20215203

(51) Int. Cl.
*H01L 23/552* (2006.01)
*B82Y 10/00* (2011.01)
(Continued)

(52) U.S. Cl.
CPC ......... *H01L 23/552* (2013.01); *H10D 48/383* (2025.01); *H10N 60/81* (2023.02)

(58) Field of Classification Search
CPC ........................ H01L 23/552; H01L 29/66977
See application file for complete search history.

(56) References Cited

U.S. PATENT DOCUMENTS 9,971,970 B1    5/2018  Rigetti et al.
10,072,879 B1 *  9/2018  El-Kady ................ H10N 10/17
(Continued)

FOREIGN PATENT DOCUMENTS

EP    2701480 A2    2/2014

OTHER PUBLICATIONS

Opinion on Patentability issued by the Finnish Patent Office for corresponding Finnish Application No. 20215203, mailed Oct. 8, 2021, 4 pages.
(Continued)

*Primary Examiner* — Vu A Vu
*Assistant Examiner* — Valerie N Newton
(74) *Attorney, Agent, or Firm* — Meunier Carlin & Curfman LLC

(57) ABSTRACT

A device for shielding at least one component from thermal radiation, the device comprising at least a first substrate with a first surface and a second surface and a second substrate with a first surface and second surface, the first surface of the second substrate being arranged to at least partially face the second surface of the first substrate. The device additionally comprises at least a first component arranged on the first surface of the second substrate or the second surface of the first substrate and a shielding arrangement comprising a plurality of shielding elements-comprising electrically conductive material, the shielding elements being configured to essentially surround at least the first component to provide (Continued)

a shielded area within which the first component is located, wherein electromagnetic radiation having wavelength longer than a selected first wavelength is essentially prevented from reaching the shielded area.

15 Claims, 8 Drawing Sheets

(51) Int. Cl.
*H10D 48/00* (2025.01)
*H10N 60/81* (2023.01)

(56) References Cited

U.S. PATENT DOCUMENTS

| | | | |
|---|---|---|---|
| 2001/0052234 A1* | 12/2001 | Venkatasubramanian | H10N 10/852 62/3.2 |
| 2002/0062855 A1 | 5/2002 | Chu et al. | |
| 2004/0001299 A1 | 1/2004 | Van Haaster et al. | |
| 2007/0023203 A1 | 2/2007 | Leizerovich et al. | |
| 2007/0267577 A1 | 11/2007 | Kindem | |
| 2008/0115967 A1 | 5/2008 | Giboney et al. | |
| 2009/0002972 A1* | 1/2009 | Carey | H01L 23/552 257/E23.114 |
| 2012/0182706 A1 | 7/2012 | Siomkos et al. | |
| 2019/0011170 A1 | 1/2019 | Morie | |
| 2020/0027844 A1 | 1/2020 | Han et al. | |
| 2020/0272925 A1 | 8/2020 | Möttönen et al. | |

OTHER PUBLICATIONS

International Search Report and Written Opinion in Application No. PCT/FI2022/050102, mailed Jun. 7, 2022, 13 pages.

Search Report from Finnish Application No. 20215203, dated Oct. 8, 2021, 2 pages.

* cited by examiner

DEVICE FOR SHIELDING AT LEAST ONE QUANTUM COMPONENT

CROSS REFERENCES

This application is a U.S. national stage application of international patent application number PCT/FI2022/050102 filed on February 17th, 2022 and claiming priority to Finnish national application number FI20215203 filed on Feb. 23, 2021.

TECHNICAL FIELD OF THE INVENTION

The invention relates to electronic devices in general. More specifically, the invention relates to a device comprising a shielding arrangement for shielding at least one component.

BACKGROUND OF THE INVENTION

Many electronic components are sensitive to electromagnetic radiation. For instance, quantum components in particular are highly susceptible to thermal radiation. A fundamental property of quantum electronics is the presence of energy gaps, which can typically be excited with photon frequencies about 5 GHz. Electromagnetic noise can also generate quasiparticles in superconductors and excite two-level systems in the passive parts of a quantum component, such as substrates and other insulating layers. Therefore, quantum electronic components are extremely sensitive to high-frequency photons even if their total power is very small.

Quantum electronics is thus usually placed in volumes having cryogenic temperatures. It is also usually not sufficient to place cryogenic electronics in a refrigerator. Since the physical volume of cryogenic and quantum electronic components is small, their electron and phonon systems can be at different temperatures. At cryogenic temperatures, the coupling between electrons and phonons is weak, and due to the small volume of chip scale quantum and classical electronics, the electronic temperature can easily rise above the phonon temperature provided by a refrigerator.

Electromagnetic noise, such as the thermal background photon spectrum, is still however a problem inside cryogenic volumes in which the quantum or other cryogenic components are placed. A photonic noise spectrum in a quantum device comprising quantum components can include high-frequency (from microwave to terahertz) components that are detrimental to the device/component operation.

The existing solutions for shielding components from thermal radiation have significant weaknesses. For example, different cryostats have different sample stage and wiring solutions, therefore the performance of cryogenic and quantum electronics can vary between cryostats. Furthermore, cryogenic space is always valuable, and many existing sample stage solutions are too bulky.

Thermal noise vanishes exponentially above the thermal emission cutoff frequency of $fc=k*T/h$, where $k$ is the Boltzmann constant, $T$ is temperature, and $h$ is the Planck constant. For example, noise above 1 GHz vanishes ideally at the temperature of about 50 mK. Therefore, millikelvin refrigerators can ideally be practically noise free in the gigahertz range. Unfortunately, this is usually not the case since there is microwave noise background that penetrates through radiation shields.

High-frequency (small-wavelength) radiation can penetrate through even very small holes of a sample stage. One must be able to open sample stages in order to change samples, and practically any joint is susceptible for radiation leakage. Multiple nested shields and vacuum tight shields can help this problem, but they can easily be too large and cumbersome for practical purposes. A volume refrigerated to millikelvin temperatures is always very expensive, and miniaturization is an ever more important question in quantum technology. Furthermore, quantum technology should be compatible with various cryostats that may have unique sample stage and wiring solutions.

An important common problem for any cryogenic technologies is the price and size of conventional millikelvin refrigerators. Such temperatures can be achieved with, e.g., dilution refrigerators that usually consist of a pulse tube stage that provides a temperature of a few kelvin, and an expensive dilution stage that can achieve millikelvin temperatures starting from few kelvins. The dilution refrigerators are still large, complicated, and expensive.

SUMMARY OF THE INVENTION

An object of the invention is to alleviate at least some of the problems in the prior art. In accordance with one aspect of the present invention, a device is provided for shielding at least one component from thermal radiation, the device comprising at least a first substrate with a first surface and a second surface, a second substrate with a first surface and second surface, the first surface of the second substrate being arranged to at least partially face the second surface of the first substrate. The device additionally comprises at least a first component arranged on the first surface of the second substrate or the second surface of the first substrate and a shielding arrangement comprising a plurality of shielding elements comprising electrically conductive material. The shielding elements are configured to essentially surround at least the first component to provide a shielded area within which the first component is located, wherein electromagnetic radiation having wavelength longer than a selected first wavelength is essentially prevented from reaching the shielded area.

A method for manufacturing a device for shielding at least one component from thermal radiation is also provided, the method comprising at least providing a first substrate with a first surface and a second surface, providing a second substrate with a first surface and second surface, and arranging the first surface of the second substrate to at least partially face the second surface of the first substrate. The method also comprises arranging at least a first component on the first surface of the second substrate or on the second surface of the first substrate and providing a shielding arrangement comprising a plurality of shielding elements comprising electrically conductive material. The method furthermore comprises configuring the shielding elements to essentially surround at least the first component to provide a shielded area, to essentially prevent electromagnetic radiation having wavelength longer than a selected first wavelength from reaching the shielded area.

The present invention provides a device with on-chip radiation shielding where at least one component may be shielded from e.g. thermal radiation. The component may be shielded also from radiation arising from the device itself, from a portion of the device that is outside of the shielded area. A component may be shielded from a hot or noisy environment within a small device in a manner where the shielding does not have to be opened or dismantled during any operation of the device.

The chip-scale radiation shielding of the invention may aid in developing cryogenic and quantum electronics that is compatible with many types of refrigerators. The present invention may provide a more compact solution than prior art e.g. metallic sample holders, and thus may help to miniaturize quantum technology, which is crucial for scaling up quantum technologies and for minimizing the operating costs. The invention may enable use of quantum technology with electrical refrigerators, due to preventing or at least reducing heat radiation from reaching a cooled active quantum component.

In one embodiment, the shielding elements may comprise at least three shielding elements, wherein a top shielding element is associated with the first substrate, a bottom shielding element is associated with the second substrate, and a coupling shielding element is disposed between the first and second substrates and couples the top and bottom shielding elements, the coupling shielding element substantially encircling the at least one first component.

The shielding elements may be configured to provide a type of Faraday cage for the at least one component in the shielded area, preventing electromagnetic radiation or noise from the outside of the enclosure or cavity (shielded area) from reaching e.g. a quantum component in the cavity. The cavity is advantageously also so small that only very high frequency radiation could have resonant modes inside it.

The minimum frequency for radiation which could have resonant modes inside a cavity is determined by the largest dimension of the cavity, i.e., length, width or height. For example, for a cavity that has length 1 mm, width 1 mm, and height 1 mm the minimum resonant frequency would be 150 GHz, while for a cavity with length 0.1 mm, width 0.1 mm, and height 0.1 mm, the minimum resonant frequency would be 1.5 THz.

Yet, if the e.g. first (quantum) component itself would require RF signals, the Faraday cages/conducting surfaces may also relocate most of the RF electric field in the vacuum between the first and second substrates, avoiding coupling to two-level systems in the substrates, which may reduce energy losses by reducing or preventing coupling of RF signals to two-level systems, as the vacuum does not contain these.

In one embodiment, one or more of the shielding elements of a device may comprise an opening, where a largest dimension of the opening is below a selected threshold value.

In some embodiments, a coupling shielding element may comprise a plurality of coupling shielding elements, wherein a distance between adjacent coupling shielding elements is below a selected threshold distance.

A selected threshold distance between adjacent coupling elements or a selected threshold value for a largest dimension of a opening may be selected/determined through the first wavelength, such that the threshold distance or value is one which only allows electromagnetic radiation having wavelength longer than the first wavelength to pass through an opening formed between the different shielding elements.

The coupling shielding elements may in one embodiment be provided through a method selected from the group of flip chip, wafer-level packaging, or providing the coupling shielding element between the substrates and applying mechanical force and/or heat.

The providing of top and/or bottom shielding elements may be carried out by well-known methods for providing conductive material on the first and/or second substrate, e.g., by metallization or by doping a semiconductor in the substrate material. The providing of coupling shielding elements may in some embodiments of the invention be carried out by 3D integration methods. The manufacturing of a device may be fast, easy to implement, and/or economical. With the present methods, also large-scale manufacture of the device may also be feasible in an expedient manner, while quality of the device as an end product may be maintained at a high level.

In an embodiment, the device may comprise at least a second component arranged on the first surface of the second substrate or the second surface of the first substrate and the coupling shielding element is configured to encircle the first and second components separately.

The invention may thus be utilized to provide a device where a plurality of components may be provided inside separate shielded areas. One or more components may be provided in a first shielded area while one or more components may be provided in e.g. second and possible subsequent shielded areas. The first and subsequent shielded areas could be configured to be essentially similar or the different shielded areas could be configured to differ from each other. For instance, a first shielded area could be configured to shield one or more components located therein from electromagnetic radiation with wavelength longer than a first wavelength, while a second shielded area could be configured to shield one or more components located in the second shielded area from electromagnetic radiation with wavelength longer than a selected second wavelength.

In one embodiment, the shielding arrangement may additionally comprise an outer coupling shielding element that is configured to encircle the first component and the coupling shielding element. The device may then additionally optionally comprise at least a further component arranged on the first surface of the second substrate or the second surface of the first substrate, wherein the further component is located outside of the shielded area and is encircled by the outer coupling shielding element. The device may thus provide nested shielded areas where the first component is essentially enclosed in two nested cavities (an inner cavity provided through at least a top shielding element, bottom shielding element, and inner coupling shielding element and an outer cavity or outer shielded area provided through at least a top shielding element, bottom shielding element, and outer coupling shielding element), providing enhanced shielding for at least the first component, and also optionally providing shielding for a further component located in the outer cavity or outer shielded area.

One embodiment of a device may comprise or be coupled to a cooling arrangement to cool at least the first component. The cooling arrangement may be a thermoelectric cooling arrangement where the second substrate is a thermoelectric cooling element.

According to the present invention, the device or at least a portion of it may be cooled to a selected temperature by utilizing a cooling device. The invention may provide a way of operating a device and component where the component may be kept at a desired temperature and simultaneously shielded from radiation where the device is small and self-contained.

Different portions of a device may be cooled to different temperatures.

Embodiments of the device may comprise third or subsequent substrates. A device may comprise at least a third substrate with a first surface and second surface, wherein the first surface of the third substrate is arranged to at least partially face the second surface of the second substrate. The device may additionally comprise a plurality of subsequent substrates each with respective first and second surfaces, wherein the first surfaces of the subsequent substrates are arranged to at least partially face the second surfaces of previous substrates.

At least a portion of subsequent substrates may be arranged to provide a cascade refrigeration system for cooling at least the first component, wherein a temperature of at least the first substrate is cooled to a temperature that is lower than the temperature of one or more further substrates, wherein at least one of the further substrates is a thermoelectric cooling element.

A device may additionally comprise at least an auxiliary component arranged on the first surface of a third or subsequent substrate or the second surface of the second or subsequent substrate and the shielding arrangement is configured to essentially surround the first and auxiliary components separately, optionally to essentially prevent electromagnetic radiation having wavelength longer than a selected auxiliary wavelength from reaching the second component, further wherein the shielding arrangement preferably comprises at least five shielding elements, of which at least three are associated with one or more substrates, such that each of the first and auxiliary components has an adjacent substrate with a top shielding element and a further adjacent substrate with a bottom shielding element, the shielding arrangement additionally comprising at least two coupling shielding elements disposed between two substrates such that the coupling shielding elements couple a top shielding element and a bottom shielding element and the coupling shielding elements substantially each encircle the first component or the auxiliary component.

A device can thus comprise a plurality of substrates (provided as a stack or disposed as sequentially facing each other) which can either all be at different temperatures or some of these can be at the same temperature. A shielding arrangement may be configured to shield a plurality of components of which some are disposed on different substrates such that the components may be shielded separately, optionally where at least two components are provided on substrates that are at different temperatures or at least the components are cooled to different temperatures. The shielding arrangement may be configured to shield different components from different wavelength radiation. For instance, a first component may be more sensitive to radiation and it may be shielded from radiation longer than a first wavelength, while a second component may be less sensitive to radiation with longer wavelengths, such that the second component may be shielded from radiation having wavelength longer than an auxiliary wavelength, where the auxiliary wavelength is longer than the first wavelength.

The device may comprise a cooling arrangement, and optionally the device may also be coupled to an external pre-cooling arrangement. The temperature of the first substrate may be cooled to a target temperature that is lower than a temperature of the at least second substrate, preferably wherein the target temperature is under 1 K, more preferably under 500 mK, most preferably under 100 mK.

At least the first component may be a quantum component or a low temperature or cryogenic component, such as a superconducting, single charge, single spin, single photon, single flux quantum, or similar small energy quanta dependent circuit or a classical circuit the performance of which is enhanced by a low temperature-related low noise level such as SFQ (Single Flux Quantum) logic or cryo-CMOS circuit. The term component may thus herein also refer to an electronic system or device which may be considered to comprise a plurality of components itself.

The at least first component may be any component/device the operation of which is dependent on the quantum mechanical energy spacing that has higher energy than the cut-off energy of thermal radiation quanta in the volume where the component is being operated. Thermal radiation quanta emitted by possible higher-temperature parts of the device may have energy of the order of or above the energy spacing of the e.g. quantum component, whereby deteriorating its operation without the radiation shielding provided by the present invention.

Embodiments of the device may additionally comprise one or more absorbing elements positioned in the shielded area, the absorbing element comprising material that is capable of absorbing electromagnetic radiation having selected wavelength, where said selected wavelength may preferably be under the first wavelength (or a wavelength that is under a wavelength from which the shielded area is shielded from).

An absorbing element may absorb at least some of the radiation that is capable of entering the shielded area. There may be some electromagnetic radiation that is able to penetrate the shielding arrangement, specifically at least radiation that has wavelength shorter than a selected first wavelength. It may be advantageous to allow such penetrating radiation to absorb into a non-critical element (the absorbing element) and transform into heat energy as opposed to being able to interact with the e.g. first component. It may be desired to alter a quality factor of the shielded area (which may be considered as a cavity) with the absorbing element, to prevent or at least limit penetrating radiation from resonating within the shielded area.

An absorbing element may be especially advantageous in the case of nested shielded areas. Penetrating radiation may then be inhibited from resonating within an outer cavity and having multiple possibilities of penetrating an inner cavity.

The novel features which are considered as characteristic of the invention are set forth in particular in the appended claims. The invention itself, however, both as to its construction and its method of operation, together with additional objects and advantages thereof, will be best understood from the following description of specific example embodiments when read in connection with the accompanying drawings.

The presented considerations concerning the various embodiments of the device may be flexibly applied to the embodiments of the method for manufacturing the device mutatis mutandis, and vice versa, as being appreciated by a skilled person.

BRIEF DESCRIPTION OF THE DRAWINGS

Next the invention will be described in greater detail with reference to exemplary embodiments in accordance with the accompanying drawings, in which.

DETAILED DESCRIPTION

Figure 1:
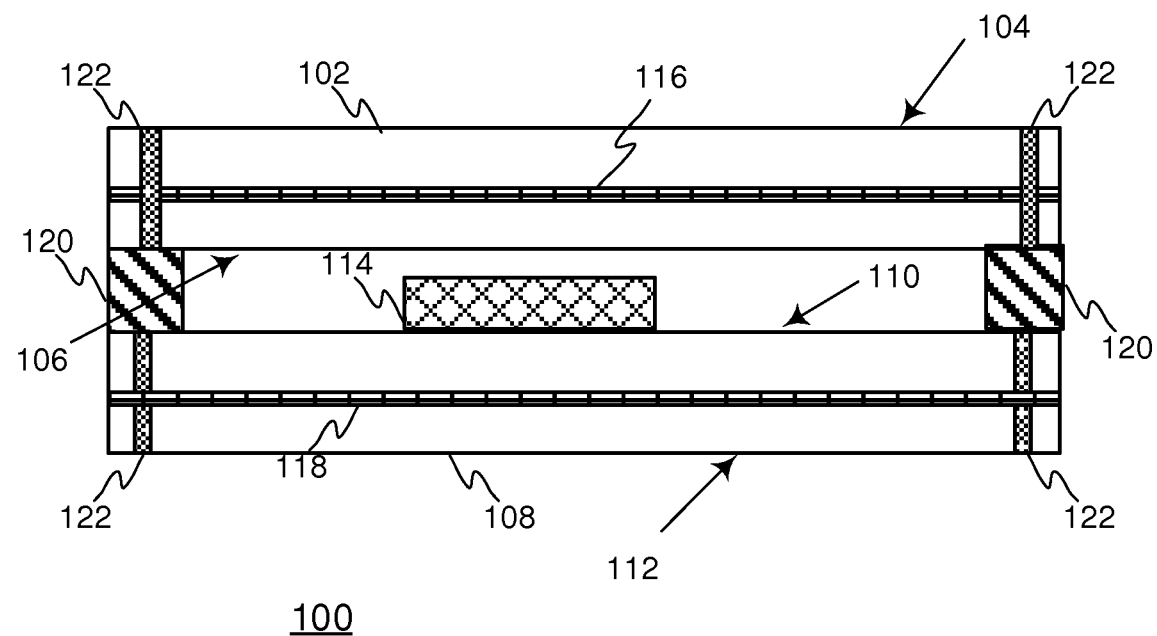
FIG. 1 shows a side view of one exemplary device according to one embodiment of the invention.

FIG. 1 illustrates a side view of one exemplary device 100 according to one embodiment of the invention. The device 100 comprises at least a first substrate 102 with a first surface 104 and second surface 106. The device additionally comprises a second substrate 108 with a first surface 110 and second surface 112. The first surface 110 of the second substrate 108 is arranged to at least partially face the second surface 106 of the first substrate 102.

Any of the substrates of a device may comprise material that is e.g. dielectric, electrically conductive or their combination. Examples of substrate materials may be degenerately doped Si and high-resistivity Si. A substrate could also comprise e.g. $SiO_2$, SiN, and/or $Al_2O_3$.

The device comprises a first component 114 that is arranged on the first surface 110 of the second substrate 108. The first component 114 may be a quantum component.

The device comprises a shielding arrangement comprising a plurality of shielding elements comprising electrically conductive material. The shielding elements are configured to essentially surround at least the first component to provide a shielded area within which the first component is located. Electromagnetic radiation having wavelength longer than a selected first wavelength may be essentially prevented from reaching the shielded area.

There are numerous ways of providing the shielding arrangement, and shielding arrangements may have different numbers of shielding elements. The common factor in the different shielding arrangements is that at least the first component 114 is surrounded by electrically conductive material in such a way that a cage-type enclosure or cavity (the shielded area) is provided for the component 114 where there are holes or gaps in the conductive material that are under a selected size, such that electromagnetic radiation having wavelength longer than a selected first wavelength may be essentially prevented from reaching the shielded area. In one embodiment, there could essentially be no holes in the enclosure (the shielding elements for an essentially continuous structure), so that the first wavelength is essentially zero, and electromagnetic radiation is substantially at least almost eliminated from reaching the first component 114.

In the example of FIG. 1, the shielding elements comprise a top shielding element 116 that is associated with the first substrate 102 and a bottom shielding element 118 is associated with the second substrate 108. The top shielding element 116 and bottom shielding element 118 can e.g. be a layer of conductor or conductive material arranged on or into the substrates 102, 108. The first and/or second substrate can itself also be considered to be or form a top shielding element 116 or bottom shielding element 118 if the substrate comprises conductive material or the first and/or second substrate can be considered to comprise a top shielding element 116 or bottom shielding element 118.

The shielding elements of the embodiment of FIG. 1 also comprise at least one coupling shielding element 120 that is disposed between the first and second substrates 102, 108 that couples the top and bottom shielding elements 116, 118, the coupling shielding element(s) substantially encircling the at least one first component 114. In the embodiment of FIG. 1, the shielding elements in this example comprise wiring elements 122 which connect the coupling shielding element 120 to the top and bottom shielding elements 116, 118. The wiring elements 122 could also be considered to form part of the top shielding element 116 and bottom shielding element 118.

The shielding elements may be termed differently and different shielding elements may also be considered to be comprised in the same shielding element according to the embodiment. As the skilled person may easily understand, the shielding elements are elements of conductive material arranged with respect to the at least first and second substrates 102, 108 and at least first component 114 such that the shielded area is provided within which the at least first component 114 is located. The at least first component 114 is thus surrounded by the shielding elements so that a shielding enclosure is provided. For example, the wiring elements 122 could be considered to be part of the top and/or bottom shielding elements 116 118, whereby the element 120 which is provided between the substrates is the coupling shielding element.

Figure 2:
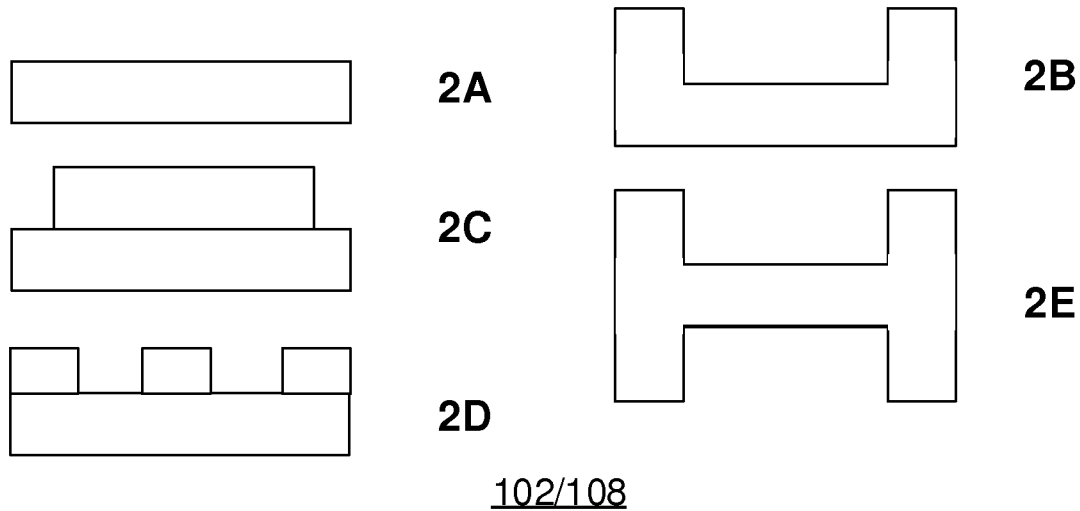
FIG. 2 illustrates examples of possible substrate types that may be utilized with the invention, FIG. 3 gives examples of at least portions of devices according to different embodiments of the invention.

FIG. 2 shows different possibly types of substrate 102, 108 that may be utilized in the invention. Substrates may be planar (FIG. 2A) or grooved (2B) or they may be combinations of a plurality of substrates (2C, 2D, 2E), such that e.g. one first substrate 102 is a combination of two stacked planar substrates. The first substrate 102 and/or the second substrate (and/or any subsequent substrate) may comprise a thickness of e.g. 100 μm–2 mm. A width and/or length or a diameter of a substrate may be for instance 1 mm-300 mm or up to industrial wafer size. Different combinations of substrate types may be used in one device 100.

Figure 3:
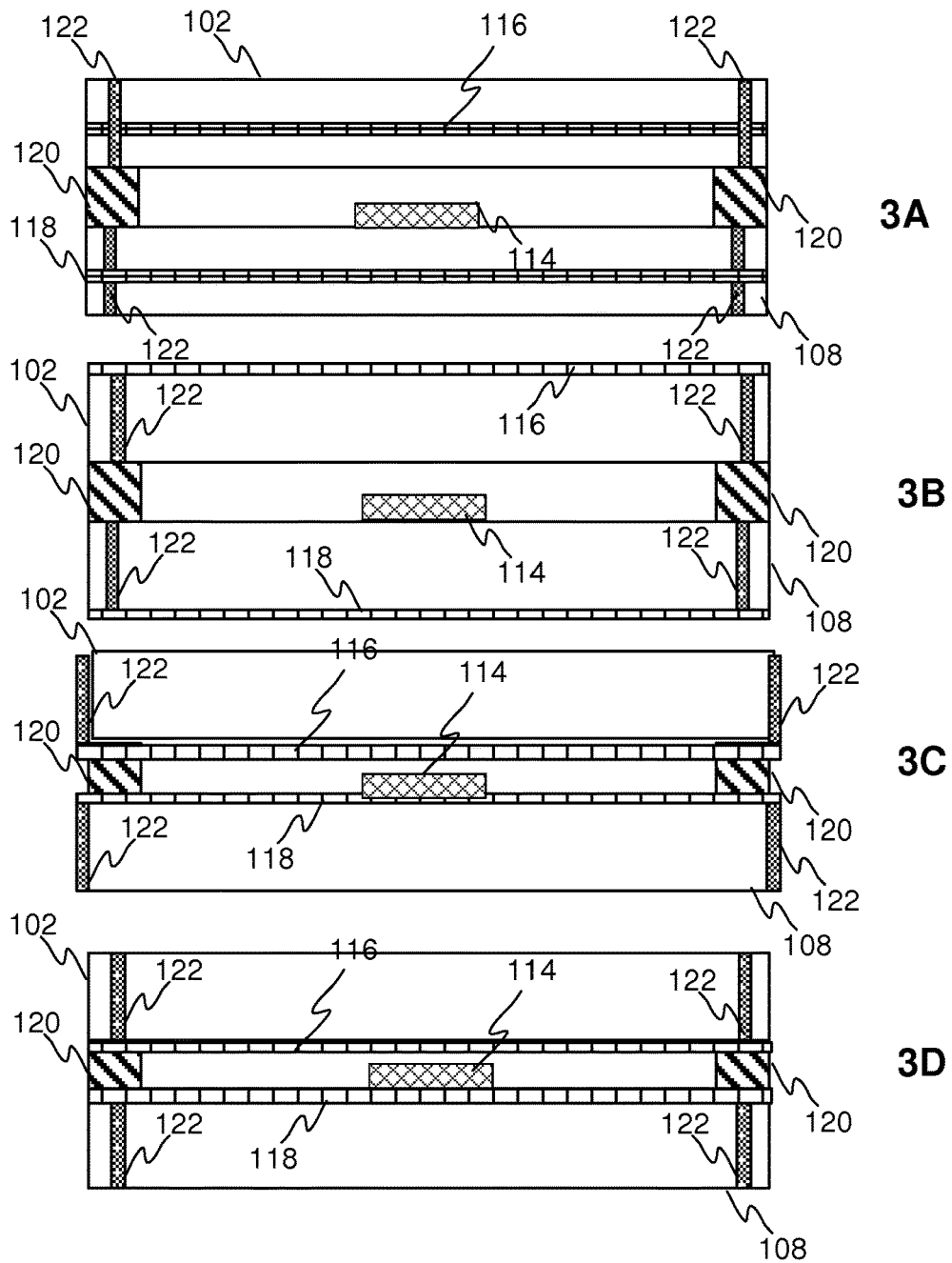

FIG. 3 shows at least portions of devices 100 according to embodiments of the invention. In different embodiments of the invention, e.g. examples of FIG. 3 could be combined in one device 100. FIG. 3 shows the first component 114 being arranged on the first surface 110 of the second substrate 108. Of course, in different embodiments, the first component 114 (or an additional component) could be arranged on the second surface 106 of the first substrate 102. FIG. 3A corresponds to FIG. 1. Here, the coupling shielding element 120 comprises conductive bumps or soft metal, while wiring elements 122 are conducting vias that connect the top shielding element 116 and bottom shielding element 118 to the intermediate coupling shielding element 120. In this example, the top shielding element 116 and bottom shielding element 118 are provided within the first substrate 102 and second substrate 108. The wiring elements 122 extend also from the top shielding element 116 and bottom shielding element 118 to the outside of the device 100 or at least to the sides of the substrates that are external to the provided shielded area, i.e. the first side 104 of the first substrate and the second side of the second substrate 108 for providing electrical connectivity for the device 100. The conductive material (any of the shielding elements) may be connected to ground with low impedance for high frequencies, i.e. capacitively or galvanically.

FIG. 3B introduces a device 100 where the top shielding element 116 and bottom shielding element 118 are provided on outer surfaces of the substrates, i.e. the top shielding element 118 is disposed on the first surface 104 of the first substrate while the bottom shielding element 118 is disposed on the second surface 112 of the second substrate 108. Also here, wiring elements 122 connect the coupling shielding element 120 to the top and bottom shielding elements 116 and 118.

In FIG. 3C, the top shielding element 116 and bottom shielding element 118 are provided on inner surfaces of the substrates, i.e. the top shielding element 118 is disposed on the second surface 106 of the first substrate while the bottom shielding element 118 is disposed on the first surface 110 of the second substrate 108. Wiring elements 122 may be provided at the edges of the substrate to electrically connect the device 100 to the external environment. At least in this type of embodiment, the wiring elements 122 may not be considered to form part of the shielding arrangement and are not needed as shielding elements.

FIG. 3 D exhibits yet one more example of a device 100, where the top shielding element 118 is disposed on the second surface 106 of the first substrate while the bottom shielding element 118 is disposed on the first surface 110 of the second substrate 108, and wiring elements 122 are provided within the substrate as vias to provide connectivity to the top shielding element 118 and bottom shielding element 118. In alternative embodiments where a first component 114 is arranged on the first surface 110 of the second substrate 108, there may be no need for wiring elements 122 on the first substrate 102.

Wiring elements 122 to provide electrical connectivity could be realized also e.g. from a side direction if the second substrate 108 extends beyond the first substrate 102 (e.g. if the second substrate 108 is longer or wider than the first substrate 102), such that for instance bonding pads could be provided at a location on the second substrate 108 that is not facing the first substrate 102.

In one embodiment, a device 100 may be manufactured using flip-chip bonding methods. Here, the coupling shielding element(s) 120 may comprise flip chip bumps.

In one other embodiment, a device 100 may be manufactured through providing coupling shielding element(s) 120 that comprise conductive material between the first substrate 102 and second substrate 108 and then providing pressure and/or heat to the substrate surface(s) such that the coupling shielding element(s) 120 is pressed and/or melted between the substrates. Here, the material of the coupling shielding element 120 is preferably soft metal, such as a metal comprising indium, indium alloy, gold, gold alloy, copper, or tin or an alloy of the aforementioned.

Figure 4:
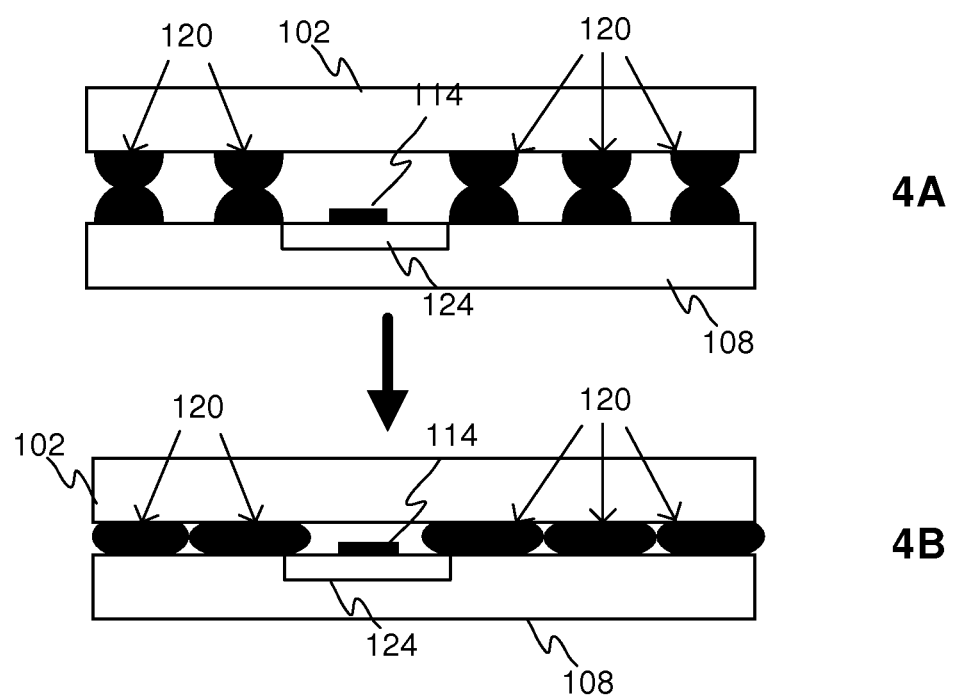
FIG. 4 depicts at least a portion of an exemplary device in two stages of manufacturing of the device according to an embodiment of the invention.

FIG. 4 shows at least a portion of a device 100 where FIG. 4A depicts the device 100 before a bonding step and FIG. 4B shows the device 100 after the bonding step. The bonding step may comprise e.g. the above-mentioned flip chip bonding (with melting and/or pressing to provide solder joints), bonding using pressure and/or heat application and soft metal, or direct bonding for example between selectively doped Si—Si wafers or partially metallized surfaces.

The coupling shielding element(s) 120 may comprise a plurality of e.g. flip chip bumps or separate pieces of metal which after the bonding step are joined as the plurality of bumps or pieces contact each other, as is shown in FIG. 4. The device may also comprise a dielectric element 124 comprising dielectric material onto which the at least first component 114 is provided. Here, signal routing, i.e. electrical connectivity to the component 114, may be provided from the side of the device.

Figure 5:
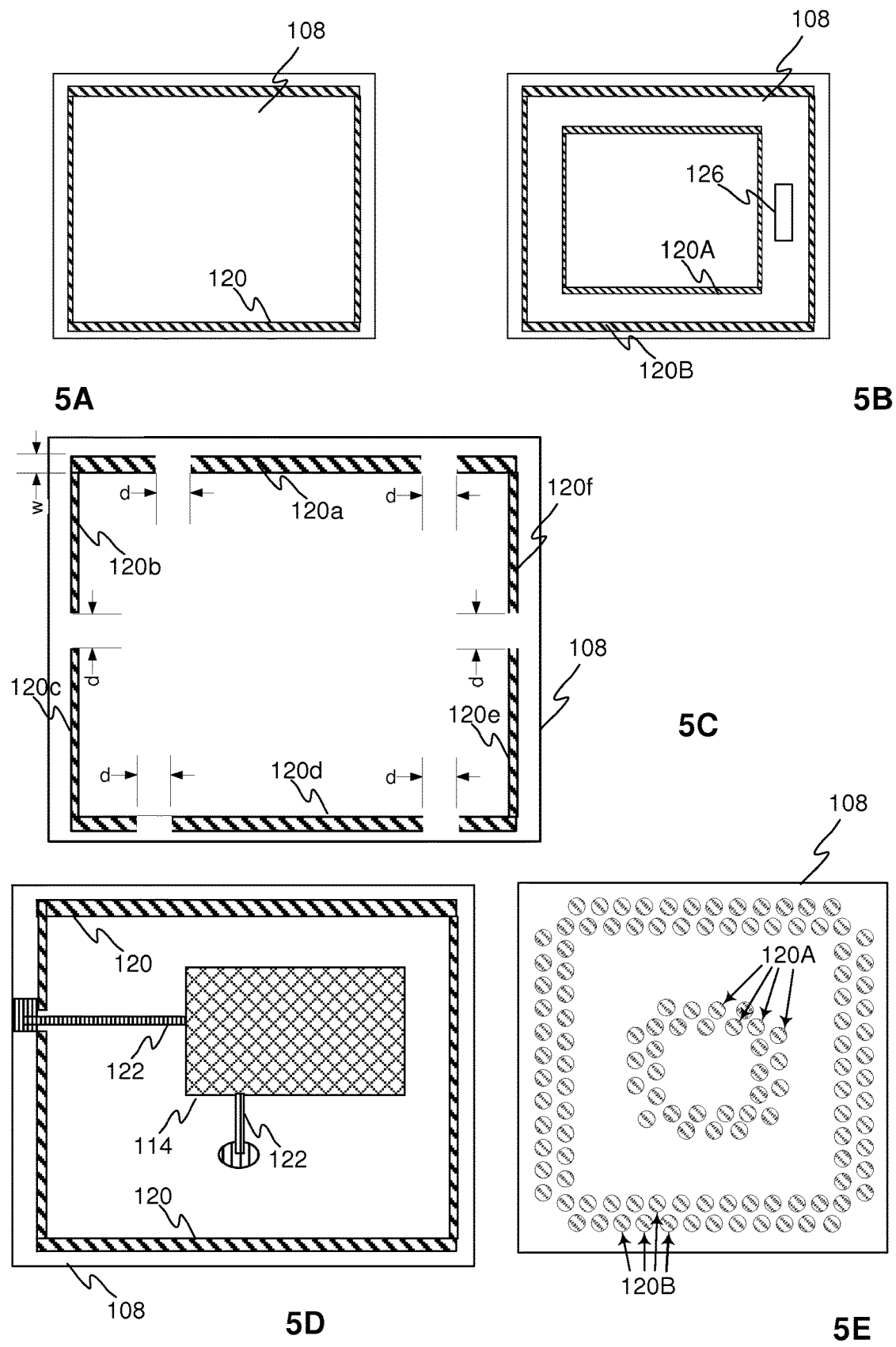
FIG. 5 shows top views of portions of devices according to embodiments of the invention.

FIG. 5 shows top views of portions of exemplary devices 100. In FIG. 5, only a second substrate 108 with a coupling shielding element 120 is shown. FIG. 5A depicts an embodiment where a coupling shielding element comprises a single continuous piece of conductive material.

FIG. 5B shows an embodiment where a coupling shielding element 120 comprises at least a further coupling shielding element. Here, at least an inner coupling shielding element 120A is surrounded by at least one outer coupling shielding element 120B. The inner and outer coupling elements 120A and 120B are configured to be coupled to top and bottom shielding elements 116 and 118 to form an inner shielded area and outer shielded area.

The embodiment of FIG. 5B therefore provides two nested shielded areas where a first component that is provided inside the perimeter of the inner coupling shielding element 120A may be essentially enclosed in two nested cavities (an inner cavity provided through at least a top shielding element, bottom shielding element, and inner coupling shielding element and an outer cavity or outer shielded area provided through at least a top shielding element, bottom shielding element, and outer coupling shielding element). In this embodiment, it may be advantageous to have the top shielding element 116 and bottom shielding element 118 provided as essentially continuous bodies of conducting material, thereby providing substantially perfect radiation shields at these locations. Nested shielding at the side walls of the cavities, formed by the inner coupling shielding element 120A and outer coupling shielding element 120B may then be sufficient for enhancing the radiation shielding at the location of the side wall of the cavity.

In other embodiments, especially in cases where a top shielding element 116 and/or a bottom shielding element 118 does not form a continuous body of conductive material (without e.g. holes in the conductive material), also inner and outer top and/or bottom shielding elements may be utilized to provide nested cavities with inner and outer shielded areas.

FIG. 5B also depicts an optional absorbing element 126 which may be placed in any shielded area of a device, here in the outer shielded area. The absorbing element 126 may comprise a material that absorbs e.g. radiation with microwave or millimeter wavelength frequencies. An absorbing element 126 could also be provided through e.g. utilizing copper or bronze powder and coating at least some of the inner portions of walls of the shielded area with such powder.

FIG. 5C shows an embodiment where a coupling shielding element 120 comprises a plurality of adjacent coupling shielding elements 120a, 120b, 120c, 120d, 120e, 120f, which are separated by a distance d. The distance d may vary between different adjacent coupling shielding elements 120a, 120b, 120c, 120d, 120e, 120f. The distance d is advantageously below a selected threshold distance. The selected threshold distance may be selected based on the wavelength of radiation that should be prevented from reaching the shielded area.

A gap or empty space may be formed in the "wall" of the enclosure forming the shielded area. Such gaps may be of different shapes, and it may be considered here that the distance d is the largest distance between any conductive material in the formed gap, as it is the largest dimension of the gap that determines which wavelengths of radiation may be able to penetrate the gap.

FIG. 5D shows an example where one or more vias for wiring elements may be formed in shielding elements. The first component 114 is also shown here on the surface of the second substrate 108. The coupling shielding element 120 comprises a via which may in this case be used to introduce a wiring element 122 connecting the first component 114 to the outside of the shielded area.

FIG. 5D also shows a wiring element 122 that extends through a via formed in the second substrate 108. This via could also be a via that is formed in the bottom shielding element 118.

In some embodiments, electromagnetic radiation could be able to penetrate a shielding element through a via formed for a wiring element 122. The via and wiring element 122 may resemble the structure of a coaxial cable or electric waveguide. Yet, the wiring element positioned in the via could e.g. attenuate radiation being able to penetrate if the wiring element 122 has high resistivity and prevent high frequency wavelength from passing through the via. If the wiring element 122 is grounded with low impedance to a potential that essentially corresponds to that of the shielding elements, then any radiation could be essentially prevented from reaching the shielded area through the via.

FIG. 5E shows one more example of an embodiment where nested shielded areas are provided, where a coupling shielding element comprises an inner coupling shielding element 120A that is surrounded by an outer coupling shielding element 120B. The coupling shielding elements 120 may in this example be formed by a plurality of e.g. flip chip bumps or separate pieces of metal. An inner and/or outer coupling shielding element 120A and/or 120B may each comprise (as depicted in FIG. 5E) two rows of flip chip bumps where an outer row of flip chip bumps may have said bumps situated such that an outer row bump is located at a joint section between two inner row bumps. Any number of rows of flip chip bumps or pieces of e.g. metal material may be utilized. The same applies also to embodiments where only one coupling shielding element 120 is provided. Yet, the plurality of e.g. flip chip bumps do not have to be positioned into "rows" in a literal sense, they can also be arranged in some other configuration where at least one further bump is positioned in another plane between a joint section or gap between two adjacent bumps.

FIG. 5E may depict a situation before a bonding step. After the bonding step, some or all of the adjacent bumps in the same row could touch each other to form a continuous entity. Also some or all of the bumps in different "rows" or in a larger sense some or all of the bumps considered to be comprised in one coupling shielding element 120 (such as inner coupling shielding element or outer coupling shielding element 120B) could physically contact each other. Yet, a coupling shielding element could still comprise a plurality of coupling shielding elements, which could e.g. be adjacent coupling shielding elements such as in FIG. 5C.

A width of the shielding elements, such as a width w of the coupling shielding element 120 (or one or more of adjacent or inner/outer coupling shielding elements) may also affect an amount or type of radiation that may be able to reach the shielded area. For instance, in the example of FIG. 5C, a larger value of width w (thicker shielding element) may attenuate the radiation that is able to pass through the gaps (defined by the distance d) more efficiently than a smaller value of w, i.e. a thinner shielding element.

The frequency of radiation that is able to reach the shielded area may also depend on the material of the shielding elements. For instance, for frequencies which have photon energy quanta that are smaller than the superconducting energy gap, shielding elements comprising superconducting material may provide essentially perfect shielding qualities with a relatively thin e.g. coupling shielding element (thin compared to shielding element widths that would have to be utilized with metal materials for shielding elements). For example, Niobium with superconducting energy gap 1.55 meV has London penetration depth of about 36 nm at low temperatures. Typical skin depth of a metallic shield, for example copper at low temperature (T<4 K), for 10 GHz, is about 100 nm, but for metals with low conductance such as titanium (when non-superconducting) skin depth can be a few μm. In principle, to provide a high shielding level (i.e. high quality shielding, meaning that radiation is prevented from reaching the shielded area at high degree), the width w of the shielding element material should be several skin depths thick. The higher the frequency of electromagnetic radiation that is to be prevented from reaching the shielded area, the thinner the shielding element may be.

Of course, radiation reaching the shielded area may not be completely prevented even if theoretically, gaps in the enclosure should not allow certain radiation into the shielded area and likewise, also some radiation with shorter wavelength than e.g. the first wavelength may be prevented from reaching the shielded area. There may therefore not be an exact cutoff wavelength that divides radiation into such that is able to reach the shielded area and that which is not able to reach the shielded area, but there may be a more gradual transition from penetrative radiation to non-penetrative radiation around the region of e.g. the first selected wavelength.

FIGS. 6-11 show exemplary devices 100 schematically, where all constituents of the device are not necessarily depicted. For example, the shielding elements may not be shown or the devices may comprise different types of shielding arrangements/shielding elements such as those discussed in connection with FIGS. 3-5.

Figure 6:
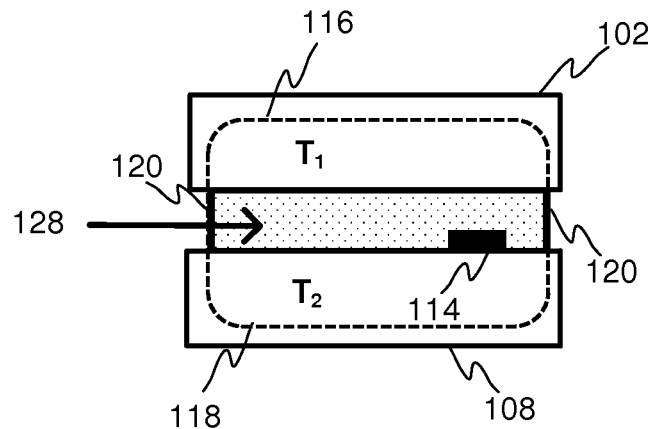
FIG. 6 illustrates an exemplary device according to one embodiment of the invention.

The device 100 of FIG. 6 comprises a cooling arrangement to cool at least the first component 114. FIG. 6 depicts the first substrate 102, second substrate 108, and shielding elements (top shielding element 116, bottom shielding element 118, and coupling shielding element 120), and shielded area 128 schematically.

The cooling arrangement of the device of FIG. 6 may be the second substrate 108. The first substrate may be cooled to a target temperature $T_1$. The target temperature $T_1$ is lower than a temperature $T_2$ of the second substrate 108.

When a substrate is utilized as a cooling arrangement, this may refer to one or more thermionic barriers/junctions being provided between the cooling arrangement substrate e.g. second substrate 108 and the substrate which is above it that should be cooled, e.g. the first substrate 102. It may then be considered that the cooling/thermionic junctions are comprised in the substrate that is used as a cooling arrangement.

The device could be coupled to an external pre-cooling arrangement. An external pre-cooling arrangement may be a pulse tube refrigerator, $^3$He refrigerator, a dilution refrigerator, a cooling arrangement utilizing diabatic magnetization cooling, or a higher temperature solid state cooler to name a few examples. In typical use case scenarios, an external pre-cooling arrangement may be utilized, while e.g. in space applications, an external pre-cooling arrangement may not be needed.

A device may comprise at least a third substrate with a first surface and second surface. The first surface of the third substrate may be arranged to at least partially face the second surface of the second substrate. A device may also additionally comprise one or more subsequent substrates each with respective first and second surfaces, wherein the first surfaces of the subsequent substrates are arranged to at least partially face the second surfaces of previous substrates.

Figure 7:
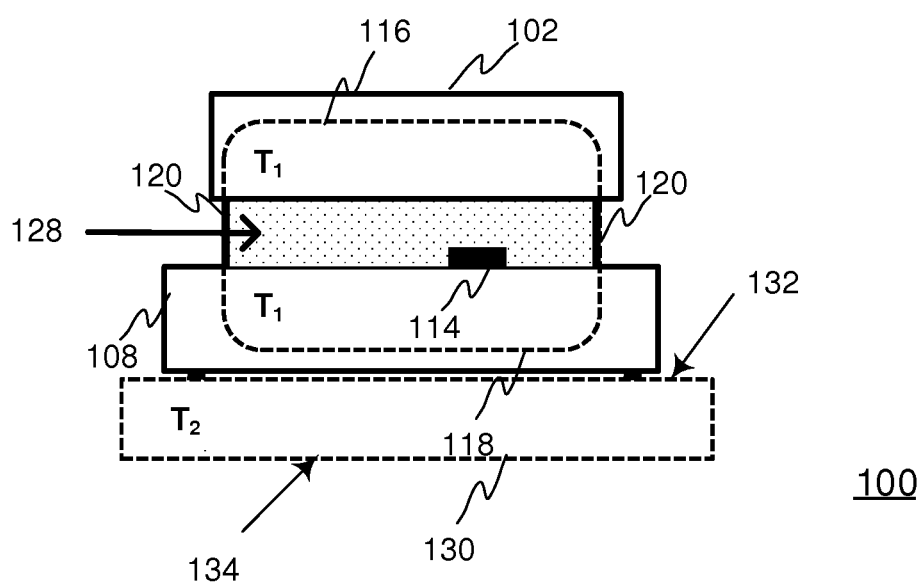
FIG. 7 illustrates an exemplary device according to one embodiment of the invention.

FIG. 7 depicts a device 100 with first and second substrates 102, 108 and shielding elements 116, 118, 120 that constitute a shielded area 128. The device additionally comprises a third substrate 130 having a first surface 132 and second surface 134. The device may thus form a stacked or multilayer structure with substrates arranged one upon the other. Yet, there may be space between each substrate or at least between a portion of the substrates.

In the device 100 of FIG. 7, the third substrate 130 may be a cooling element, such as thermoelectric cooling element, that has a temperature $T_2$, while the third substrate 130 is configured to cool at least the second substrate 108 and first substrate 102 (which is in thermal connection with the second substrate 108) to a target temperature $T_1$ which is a lower temperature than $T_2$. The target temperature $T_1$ may be a target temperature for at least the first substrate 102 and/or a target temperature for the at least one component 114.

When a device has a third or a plurality of subsequent substrates, at least a portion of the substrates may be arranged to provide a cascade refrigeration system for cooling at least the first component 114, where a temperature of at least the first substrate 102 is cooled to a target temperature $T_1$ that is lower than the temperature of one or more further substrates. At least one of the further substrates may be a thermoelectric cooling element.

Figure 8:
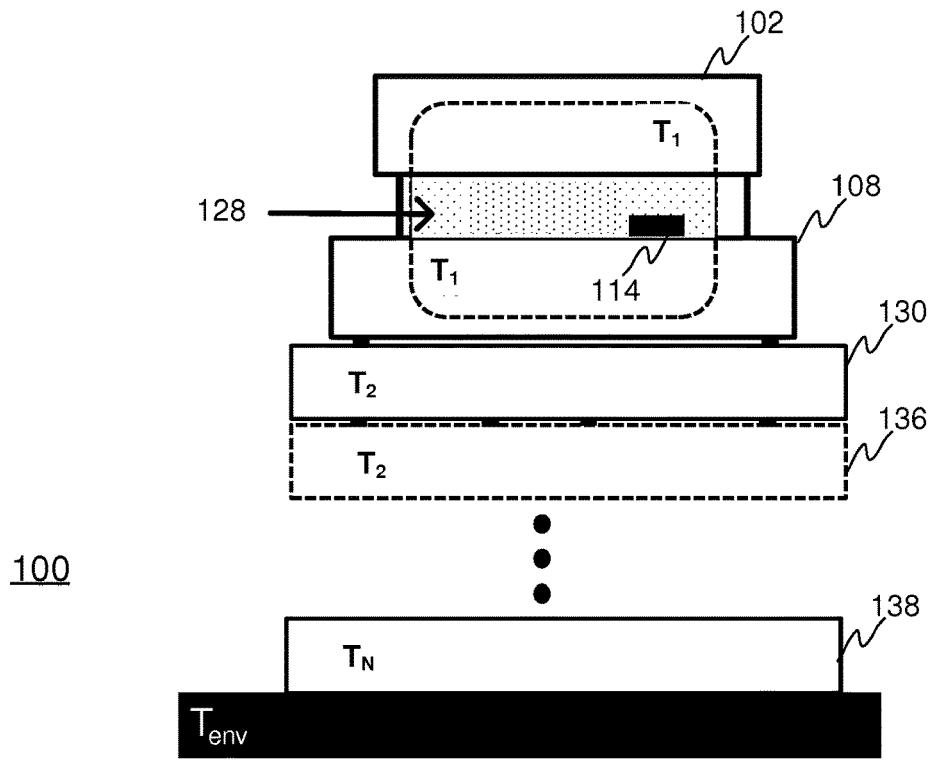
FIG. 8 illustrates an exemplary device according to one embodiment of the invention.

FIG. 8 shows a device with first and second substrates 102 and 108 and provided shielded area 128 as explained before, with additional third substrate 130, fourth substrate 136, and subsequent substrates up to a final substrate 138. At least some of the subsequent substrates may be cooling elements to provide a cascade cooling/refrigeration system for cooling the first component 114. The target temperature $T_1$ is a temperature of also the second substrate 108 in this example, which is lower that a temperature $T_2$ of the third and fourth substrates 130 and 136. The temperature $T_2$ is here lower than a temperature $T_N$ of the final (cooling) substrate 138.

In typical devices, a final substrate, such as that depicted as 138 in FIG. 8 may be well thermally anchored to the temperature of the environment $T_{env}$, and a substrate above it may be a first cooling stage/substrate. Here, $T_N$ may be equivalent to or close to $T_{env}$ (in practice, however, $T_N > T_{env}$, because the cooling efficiency may not be high and heat may be heat sinked to the $T_{env}$, yet the difference between $T_N$ and $T_{env}$ can be marginal). The substrate provided above the final substrate 138 may then be a cooling element that provides a temperature lower than $T_N/T_{env}$.

With a suitable cooling element, e.g. with an NIS (Normal Metal-Insulator-Superconductor) tunneling junction provided between a cooling substrate (e.g. 130 of FIG. 8) and a substrate provided above it (e.g. second substrate 108 of FIG. 8), a phonon temperature $T_{ph}$, i.e. a temperature of the atomic lattice of the e.g. second substrate 108, which is equivalent to the electron temperature $T_N$ can be achieved.

Figure 9:
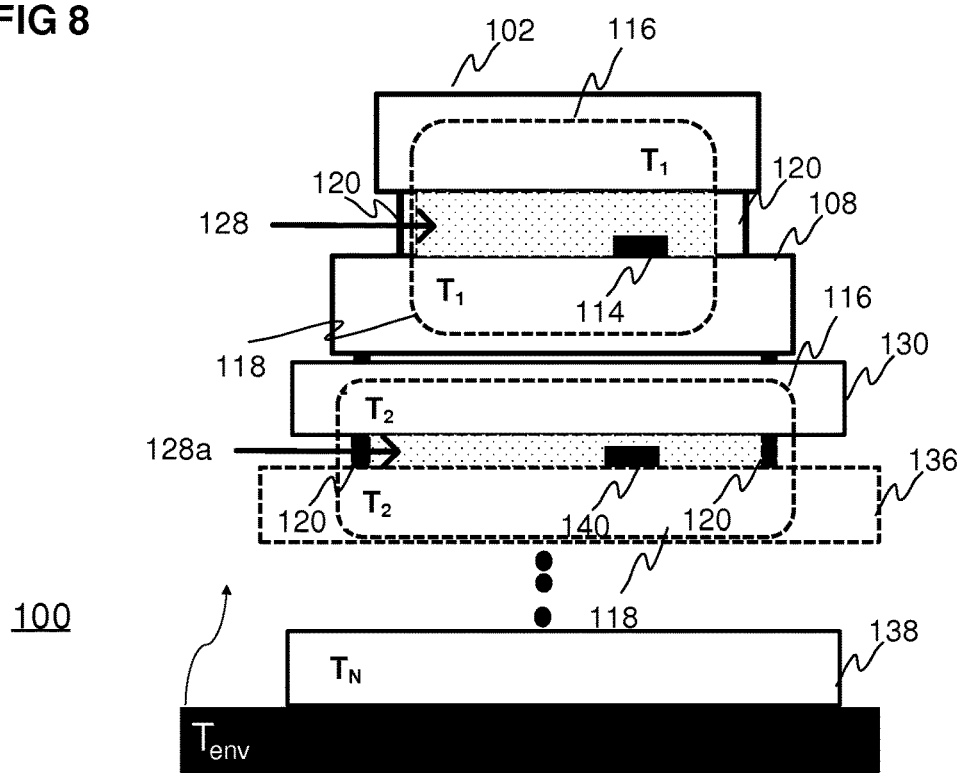
FIG. 9 illustrates an exemplary device according to one embodiment of the invention.

FIG. 9 illustrates (schematically) a device 100 where again the first and second substrates 102 and 108 and provided shielded area 128 may be as explained before, with additional third substrate 130, fourth substrate 136, and subsequent substrates up to a final substrate 138. The cooling substrates and temperatures may e.g. be such as explained above for FIG. 8. Also other numbers of e.g. substrates may be possible, such that the fourth substrate 136 is the final substrate, for instance.

In the example of FIG. 9, the device additionally comprises an auxiliary component 140 which is arranged on a first surface of the fourth substrate 136. The third substrate comprises or is associated with a top shielding element 116 while the fourth substrate 136 comprises or is associated with a bottom shielding element 118 and a coupling shielding element 120 couples these to form a auxiliary shielded area 128a within which the auxiliary component 140 is located. The shielding arrangement may then be considered to comprise at least six shielding elements, where the coupling shielding elements 120 encircle the first component 114 and auxiliary component 140 separately.

The shielding elements associated with the shielded area 128 and auxiliary shielded area 128a may be essentially equivalent or they may differ from each other. Selected wavelengths of radiation that are prevented from reaching the shielded areas 128, 128a may be essentially equivalent or they may be different. The shielding elements may be selected accordingly.

With a device such as that of FIG. 9, different components, such as different types of quantum components/devices can be placed in different temperature stages depending on their possible operation temperature/dissipation heat load etc. Other embodiments of devices 100 may yet have further auxiliary components arranged e.g. between fourth and fifth or fifth and sixth substrates, for example.

Figure 10:
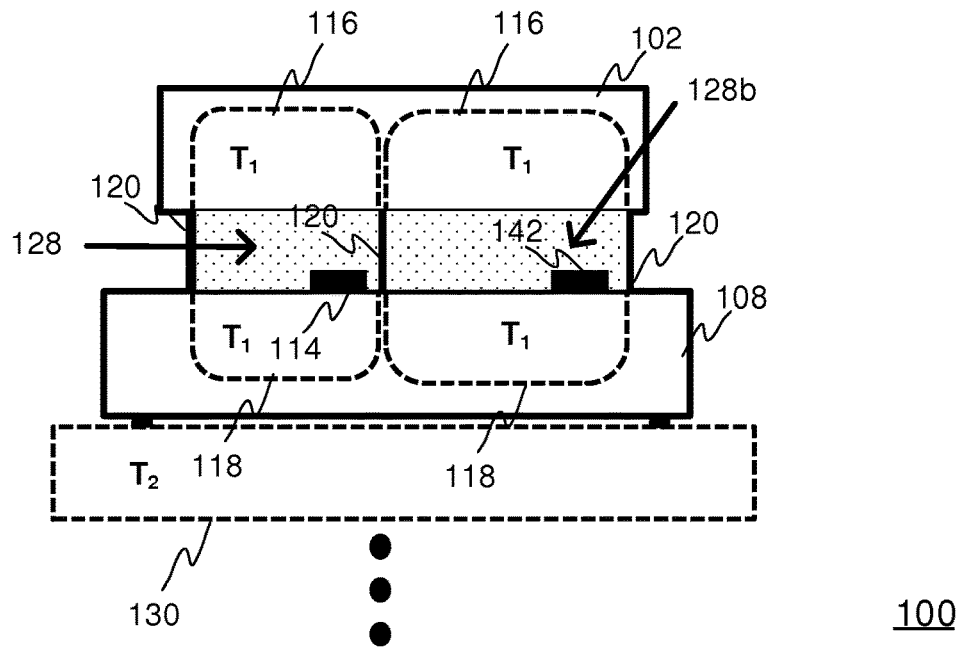
FIG. 10 illustrates an exemplary device according to one embodiment of the invention.

The device 100 of FIG. 10 has first and second substrates 102 and 108 and provided shielded area 128 for first component 114, with at least additional third substrate 130, where at least the third substrate 130 may be a cooling element as explained before. The shielding arrangement comprising shielding elements may be configured such that a second component 142 provided on the first surface of the second substrate 108 is encircled separately from the first component 114 by the coupling shielding element 120, such that a second shielded area 128b may be provided, within which the second component 142 is located. The coupling shielding element 120 may also here comprise a plurality of adjacent coupling shielding elements 120a, 120b, 120c, 120d, 120e, 120f (not shown in FIG. 10). The shielding arrangement may be configured to prevent radiation having wavelength longer than a selected first wavelength from reaching the first component 114/shielded area 128 and prevent radiation having wavelength longer than a selected second wavelength from reaching the second component 142/second shielded area 128b (the first and second wavelength may also be equivalent).

The top shielding element 116 can be provided as one shielding element or it may comprise a plurality of elements, and the bottom shielding element 118 may also be provided as one shielding element or it may comprise a plurality of elements.

Figure 11:
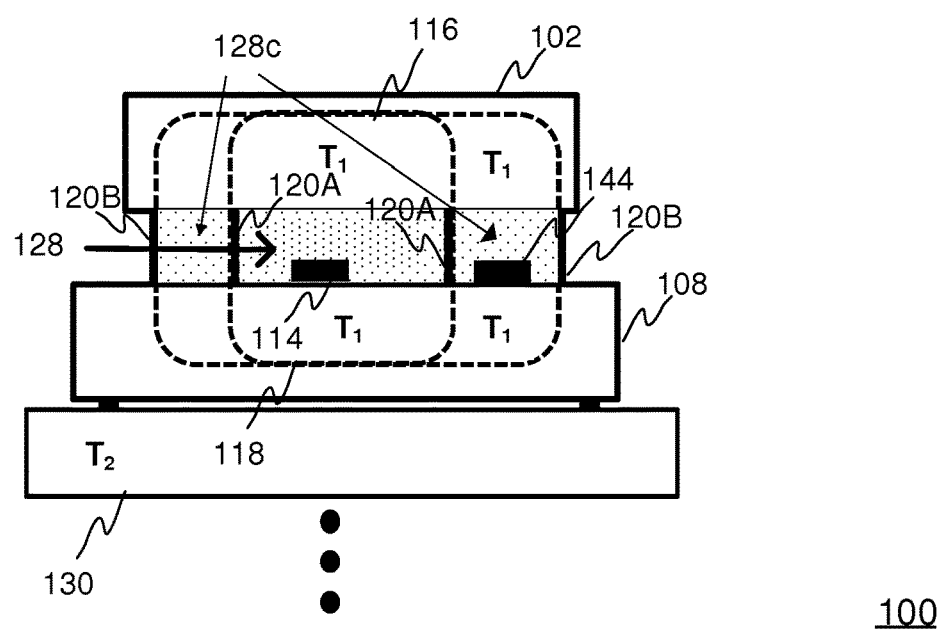
FIG. 11 illustrates an exemplary device according to one embodiment of the invention.

FIG. 11 depicts a device 100 again with first and second substrates 102 and 108 and provided shielded area 128 for first component 114, with at least additional third substrate 130, where at least the third substrate 130 may be a cooling element. The shielding arrangement comprises at least one top shielding element 116, at least one bottom shielding element 118, at least one inner coupling shielding element 120A and at least one outer coupling shielding element 120B, such that an outer shielding area 128c is provided that nests or comprises within it the inner shielded area 128. A further component 144 may be provided in the outer shielded area 128c. The shielding arrangement may be configured to prevent radiation having wavelength longer than a selected first wavelength from reaching the shielded area 128 and prevent radiation having wavelength longer than a selected further wavelength from reaching the outer shielded area 128c. The first and further wavelengths may also be essentially equivalent.

The shielding elements of the device 100 of FIG. 11 that constitute the (inner) shielded area 128 may be configured to shield the first component 114 from radiation having wavelength longer than a selected first wavelength. Yet, the shielding elements constituting the outer shielded area 128c may provide an additional shield that may compensate the effect of the e.g. inner coupling shielding element 120A possibly being an imperfect shielding element or one that does not function to entirely shield the first component 114 from radiation having wavelength longer than the selected first wavelength. This could occur if unwanted openings are present e.g. in the coupling shielding element 120.

The outer shielded area 128c may comprise photons that have higher energy than thermal photons arising from temperature $T_1$. The photon spectrum of the outer shielded area 128c may correspond to a thermal spectrum with temperature higher than $T_1$, but the spectrum also may not correspond to any temperature. Yet, the photon spectrum in the inner shielded area 128 may essentially correspond to the thermal spectrum of the target temperature $T_1$ due to the compensating effect of the outer shielded area 128c.

In the case of the inner and outer shielded areas 128, 128c, the shielding elements may provide shielding or attenuation of radiation essentially without having correlation. This may be the case especially if e.g. the outer shielded area 128c comprises an absorbing element 126 (not depicted in FIG. 11) and/or if possible openings in the inner coupling element 120A and outer coupling element 120B are not aligned. For instance, if the attenuation of radiation for a certain wavelength is 33 dB in connection with an inner shielded area 128 and the attenuation of such radiation with certain wavelength is 29 dB in connection with an outer shielded area 128c, then together they may provide an attenuation of 62 dB.

Figure 12:
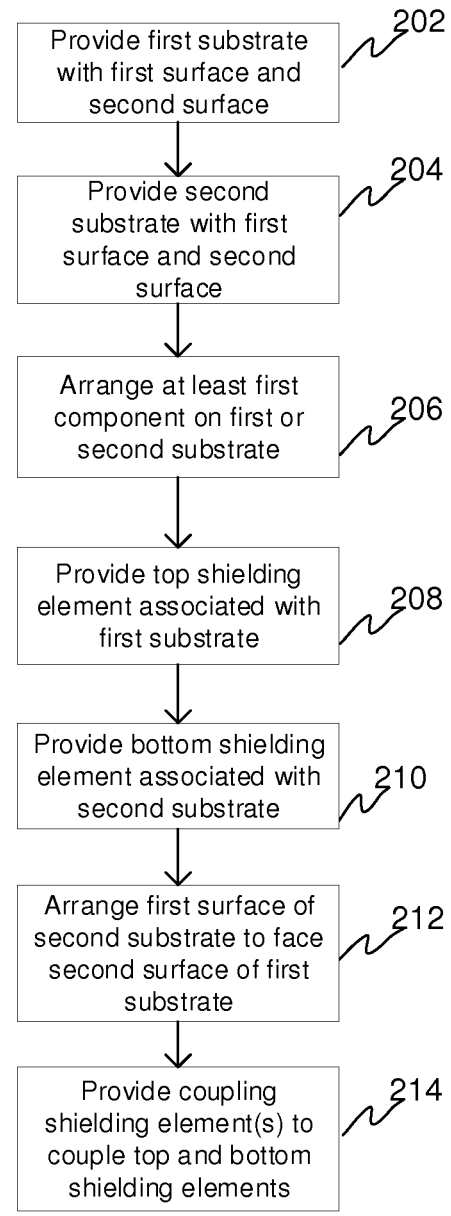
FIG. 12 shows a flow chart of a method of manufacturing a device according to one embodiment of the invention.

FIG. 12 shows a flow chart of a method of manufacturing a device 100 according to one advantageous embodiment of the invention. At least a first substrate 102 is provided at 202, the first substrate having first and second surfaces. At least a second substrate 108 is provided at 204, the second substrate having first and second surfaces. At least one first component 114 is arranged 206 on the first or second substrate.

A top shielding element may be provided 208 that is associated with the first substrate and a bottom shielding element may be provided 210 that is associated with the second substrate. Steps 208 and 210 could involve e.g. providing conductive material onto or into the substrates.

The first surface of the second substrate is arranged 212 to face the second surface of first substrate.

Finally, one or more coupling shielding elements 120 may be provided 214, where the coupling shielding element couples the top and bottom shielding elements and wherein the coupling shielding element may essentially encircle the first component 114.

Some of the steps e.g. in FIG. 12 could also be done in differing order. For instance, depending on the manufacturing method, the providing of coupling shielding elements 120 could comprise providing such elements on the first or second substrate and thereafter arranging the first and second substrate 102 and 108 to face each other.

In one embodiment, the providing of the coupling shielding element(s) 120 may be carried out through flip chip methods. The coupling shielding elements may therefore be flip chip bumps that are melted and/or pressed to form the coupling shielding element 120 that couples the top and bottom shielding elements 116 and 118.

In flip-chip jointing, the metallic flip chip bumps 120 can be placed relatively close to each other, so that the distance between two bumps is about the same as the diameter of the bumps (depicted also in FIG. 4A). When the substrates are pressed, the bumps 120 widen so that they can touch each other (as seen in FIG. 4B) and it is possible to provide a coupling shielding element 120 having desired width. The bumps 120 can be placed so that the distance between two bumps is about the same as the diameter of the bumps also between adjacent bumps from a top view of the device 100 to create an opening-free coupling shielding element 120 as a continuous entity.

In one embodiment, wafer-level packaging methods may be utilized, whereby devices may be advantageously manufactured on a large scale cost-effectively. This can be achieved for example with thermo-compression, metal alloy, or fusion bonding utilizing degenerately doped semiconducting and/or metallic regions to form the shielding elements. For example these techniques enable wafer-scale pre-packaging of multiple devices at a time.

Wafer level thermo-compression bonding or (low temperature) metal alloy bonding may enable making hermetic contacts on wafer level between metals. Yet, also other methods may be used to bond different parts of the device. For instance, fusion bonding may be suitable for e.g. CMOS components.

An exemplary method of manufacturing at least a portion of a device could, in case of wafer-level packaging involving fusion bonding, e.g. comprise:

etching a cavity on one wafer, fabricating component(s) on another planar wafer, fabricating through wafer vias to provide electrical access from below the components, degenerately doping the contact regions (non-cavity areas), and bonding the wafers to each other.

Fusion bonding may require high temperatures and very clean surfaces. Roughly similar processes at lower temperature could be carried out by changing the degenerately doped silicon to gold and using thermo-compression bonding.

In yet one more embodiment, the providing of the coupling shielding element(s) 120 may comprise providing soft metal material between the first and second substrates 102 and 108, arranging them to face each other, and applying mechanical force and/or heat to form the coupling shielding element.

The invention has been explained above with reference to the aforementioned embodiments, and several advantages of the invention have been demonstrated. It is clear that the invention is not only restricted to these embodiments, but comprises all possible embodiments within the spirit and scope of inventive thought and the following patent claims.

The features recited in dependent claims are mutually freely combinable unless otherwise explicitly stated.

The invention claimed is:

1. A device for shielding at least one component from thermal radiation, the device comprising at least
   a first substrate with a first surface and a second surface,
   a second substrate with a first surface and second surface, the first surface of the second substrate being arranged to at least partially face the second surface of the first substrate,
   at least a first component arranged on the first surface of the second substrate or the second surface of the first substrate, and
   a shielding arrangement comprising a plurality of shielding elements comprising electrically conductive material, the shielding elements being configured to essentially surround at least the first component to provide a shielded area within which the first component is located, the shielding elements comprising at least a top shielding element which is associated with the first substrate and a bottom shielding element associated with the second substrate, wherein
   electromagnetic radiation having wavelength longer than a selected first wavelength is essentially prevented from reaching the shielded area, and
   the device additionally comprises at least one further substrate with a first surface and second surface, wherein the first surface of the at least one further substrate is arranged to at least partially face the second surface of the second substrate or the second surface of a previous further substrate in a formed stack, wherein at least a portion of the substrates are arranged to provide a cascade refrigeration system for cooling at least the first component, wherein a temperature of at least the second substrate is cooled to a temperature that is lower than the temperature of at least one further substrate in the stack and the temperature of at least one further substrate is cooled to a temperature that is lower than the temperature of at least one subsequent further substrate in the stack.

2. The device of claim 1, wherein the shielding elements further comprise at least one coupling shielding element is disposed between the first and second substrates and coupling the top and bottom shielding elements, the coupling shielding element substantially encircling the at least one first component.

3. The device of claim 1, wherein one or more of the shielding elements comprises an opening, wherein a largest dimension (d) of the opening is below a selected threshold value.

4. The device of claim 2 wherein the device comprises at least a second component arranged on the first surface of the second substrate or the second surface of the first substrate and the coupling shielding element is configured to encircle the first and second components separately.

5. The device of claim 2 wherein the shielding arrangement additionally comprises an outer coupling shielding element that is configured to encircle the first component and the coupling shielding element, further wherein the wherein the device additionally optionally comprises at least a further component arranged on the first surface of the second substrate or the second surface of the first substrate, wherein the further component is located outside of the shielded area and is encircled by the outer coupling shielding element.

6. The device of claim 1, wherein the device comprises a cooling arrangement to cool at least the first component, optionally wherein the cooling arrangement is a thermoelectric cooling arrangement where the second substrate is a thermoelectric cooling element.

7. The device of claim 1, wherein the device comprises a plurality of subsequent further substrates each with respective first and second surfaces, wherein the first surfaces of the subsequent substrates are arranged to at least partially face the second surfaces of previous substrates in the formed stack of substrates.

8. The device of claim 1, wherein at least one of the further substrates is optionally a thermoelectric cooling element.

9. The device of claim 1, wherein the device additionally comprises at least an auxiliary component arranged on the first surface of the second or subsequent substrate or the second surface of the second or subsequent substrate and the shielding arrangement is configured to essentially surround the first and auxiliary components separately, optionally to essentially prevent electromagnetic radiation having wavelength longer than a selected auxiliary wavelength from reaching the auxiliary component, further wherein the shielding arrangement preferably comprises at least five shielding elements, of which at least three are associated with one or more substrates, such that each of the first and auxiliary components has an adjacent substrate with a top shielding element and a further adjacent substrate with a bottom shielding element, the shielding arrangement additionally comprising at least two coupling shielding elements disposed between two substrates such that the coupling shielding elements couple a top shielding element and a bottom shielding element and the coupling shielding elements substantially each encircle the first component or the auxiliary component.

10. The device of claim 1, wherein the device comprises a cooling arrangement, optionally wherein the device is coupled to an external pre-cooling arrangement, and wherein the temperature of the first substrate is cooled to a target temperature that is lower than a temperature of the at least second substrate, preferably wherein the target temperature is under 1 K, more preferably under 500 mK, most preferably under 100 mK.

11. The device of claim 1, wherein the at least first component is a quantum component or a low temperature component.

12. The device of claim 1, wherein the device additionally comprises an absorbing element positioned in the shielded area, the absorbing element comprising material that is capable of absorbing electromagnetic radiation having selected wavelength, said selected wavelength preferably being under said first wavelength.

13. A method of manufacturing a device for shielding at least one component from thermal radiation, the method comprising at least
   providing a first substrate with a first surface and a second surface,
   providing a second substrate with a first surface and second surface,
   arranging at least a first component on the first surface of the second substrate or on the second surface of the first substrate,
   arranging the first surface of the second substrate to at least partially face the second surface of the first substrate, and
   providing a shielding arrangement comprising a plurality of shielding elements comprising electrically conductive material,
   configuring the shielding elements to essentially surround at least the first component to provide a shielded area, to essentially prevent electromagnetic radiation having wavelength longer than a selected first wavelength from reaching the shielded area, the shielding elements comprising at least a top shielding element which is associated with the first substrate and a bottom shielding element associated with the second substrate, providing at least one further substrate with a first surface and a second surface, arranging the substrates as a stack such that the first surface of the at least one further substrate to at least partially faces the second surface of the second substrate or the second surface of previous further substrate in the formed stack, and providing a cascade refrigeration system for cooling at least the first component, by the cascade refrigeration system being configured for cooling a temperature of at least the temperature of at least one further substrate in the stack and cooling the temperature of at least one further substrate to a temperature that is lower than the temperature of at least one subsequent further substrate in the stack.

14. The method of claim 13, wherein the providing of the shielding arrangement comprises providing at least three shielding elements, comprising providing a top shielding element that is associated with the first substrate, providing a bottom shielding element that is associated with the second substrate, and providing at least one coupling shielding element to be disposed between the first and second substrates to couple the top and bottom shielding elements, the coupling shielding element substantially encircling the at least one first component.

15. The method of claim 14, wherein providing the coupling shielding element is carried out through a method selected from the group of flip chip, wafer-level packaging, or providing the coupling shielding element between the substrates and applying mechanical force and/or heat.

* * * * *